United States Patent
Dubin et al.

(10) Patent No.: US 7,157,380 B2
(45) Date of Patent: Jan. 2, 2007

(54) DAMASCENE PROCESS FOR FABRICATING INTERCONNECT LAYERS IN AN INTEGRATED CIRCUIT

(75) Inventors: Valery M. Dubin, Portland, OR (US); Makarem A. Hussein, Beaverton, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 10/746,420

(22) Filed: Dec. 24, 2003

(65) Prior Publication Data

US 2005/0148190 A1   Jul. 7, 2005

(51) Int. Cl.
    *H01L 21/302*   (2006.01)
(52) U.S. Cl. .............. 438/723; 438/624; 438/638; 438/706
(58) Field of Classification Search ........ 438/700, 438/706, 710, 624, 634, 638, 723; 257/638, 257/639
    See application file for complete search history.

(56) References Cited

U.S. PATENT DOCUMENTS

| | | | |
|---|---|---|---|
| 6,165,898 A | 12/2000 | Jang et al. | |
| 6,251,770 B1 | 6/2001 | Uglow et al. | |
| 6,287,955 B1 | 9/2001 | Wang et al. | |
| 6,395,632 B1 | 5/2002 | Farrar | |
| 6,911,397 B1 * | 6/2005 | Jun et al. | 438/700 |
| 2002/0173143 A1 * | 11/2002 | Lee et al. | 438/637 |
| 2003/0001240 A1 * | 1/2003 | Whitehair et al. | 257/638 |
| 2003/0064580 A1 | 4/2003 | Ott et al. | |
| 2003/0207561 A1 | 11/2003 | Dubin et al. | |
| 2004/0056366 A1 * | 3/2004 | Maiz et al. | 257/779 |
| 2005/0032355 A1 * | 2/2005 | Yeh et al. | 438/637 |

OTHER PUBLICATIONS

PCT Int'l Search Report, PCT/US2004/043653, dated Apr. 11, 2005, 3 pages.
Andideh, E. Scheran, et al., "Interfacial adhesion of copper-low k interconnects," Interconnect Technology Conference, 2001. Proceedings of the IEEE 2001 Int'l, found at: http://ieeeexplore.ieee.org/xpls/absprintf.jsp?arnumber=930077, 1 pg.

* cited by examiner

*Primary Examiner*—Lan Vinh
(74) *Attorney, Agent, or Firm*—Blakely, Sokoloff, Taylor & Zafman LLP

(57) ABSTRACT

A damascene process using a doped and undoped oxide ILD is described. The selectivity between the carbon doped and carbon free oxide provides an etching stop between the ILD's in addition to providing mechanical strength to the structure.

18 Claims, 3 Drawing Sheets ured to the field of interconnect structures in integrated circuits, particularly those having inlaid vias and conductors formed with a damascene process.

DAMASCENE PROCESS FOR FABRICATING INTERCONNECT LAYERS IN AN INTEGRATED CIRCUIT

FIELD OF THE INVENTION

The invention relates to the field of interconnect structures in integrated circuits, particularly those having inlaid vias and conductors formed with a damascene process.

PRIOR ART

Several layers of interconnections are often formed above a substrate in an integrated circuit. Each of the layers includes vias and conductors inlaid in an interlayer dielectric (ILD). Often, a relatively dense dielectric such as silicon nitride (SiN) or silicon carbide (SiC) is used between the layers to provide an etchant stop, so that when etching via openings in one layer, unwanted etching does not occur in an underlying layer. SiN or SiC layer also serves as a diffusion layer to block copper diffusion and migration to ILD.

The ILD for a single layer of interconnects sometimes has two layers of different dielectric materials. This is used in place of an etchant stop layer, since etchants can be selected which discriminate between the different materials. This is described in U.S. Pat. No. 6,395,632. Another technique to avoid an etchant stop, is to alternate the dielectric material in each ILD. This is described in co-pending application Ser. No. 09/368,459, filed Sep. 28, 2001, and entitled, "A Method for Making Dual-Damascene Interconnects Without an Etchant Stop Layer by Alternating ILD's".

BRIEF DESCRIPTION OF THE DRAWINGS

FIG. 2 illustrates a cross-sectional elevation view of a substrate having thereon a first layer of interconnects.

FIG. 3 illustrates the structure of FIG. 2 with an ILD formed from a layer of a carbon free oxide and a layer of a carbon doped oxide.

FIG. 4 illustrates the structure of FIG. 3, after via openings and trenches are etched into the oxide layers.

FIG. 5 illustrates the structure of FIG. 4, after formation of a conductive layer, planarization, and the formation of cladding on the conductors.

FIG. 6 illustrates the structure of FIG. 5, after an additional layer of interconnects are fabricated.

DETAILED DESCRIPTION

In the following description, a method for fabricating an interconnect structure and the structure itself is described. Numerous specific details are set forth, such as specific materials and processing steps. It will be apparent, to one skilled in the art, that these details are not necessary to practice the present invention. In other instances, well-known processing has not been described in detail, in order not to unnecessarily obscure the present invention.

Figure 1:
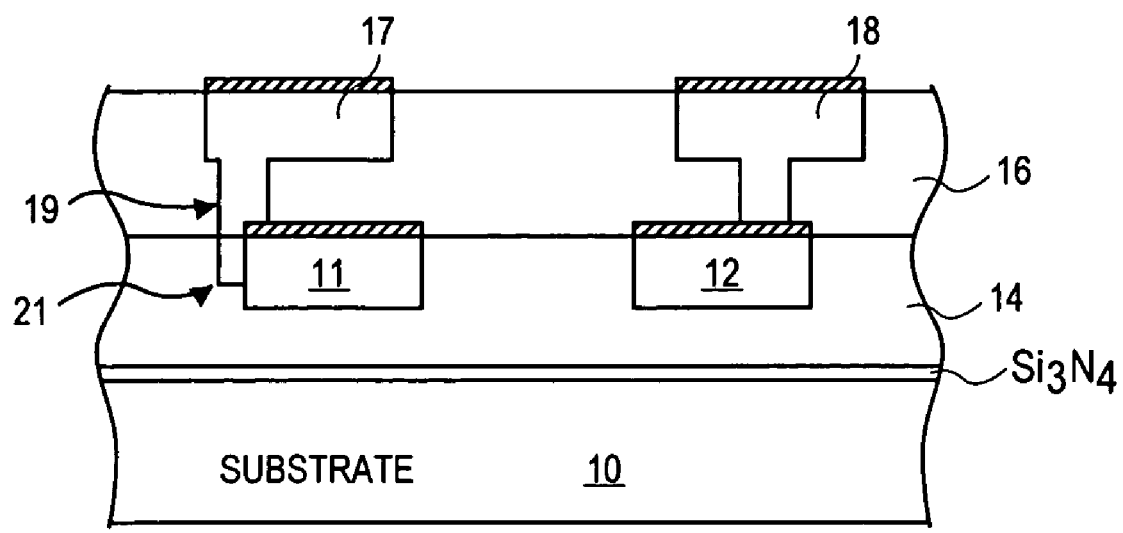
FIG. 1 is a cross-sectional elevation view of a prior art interconnect structure. This figure is used to illustrate micro trenching that can occur in an unlanded via.

Referring first to FIG. 1, a problem associated with prior art processing is illustrated. A substrate 10, which may include active devices is illustrated, covered with a silicon nitride layer. A first layer of interconnects 14 is formed on the silicon nitride layer and includes conductors 11 and 12.

In the next layer of interconnects 16, two conductors 17 and 18 are illustrated. The via 19, intended to interconnect the conductors 11 and 17, is partially unlanded, that is, the via does not entirely rest on the conductor 11. Rather, due to misalignment, the via is only partially resting on the conductor 11.

During the etching of a via opening for the via 19, the etchant will etch a micro trench 21 along the side of the conductor 11. This trench can result in several problems in an integrated circuit. For instance, the micro trench 21 may not fill during the deposition of a barrier layer and conductive material. Consequently, an undesirable void will remain in the ILD 14. Another possible problem is that the micro trench 21 will not entirely be covered with a barrier layer and will therefore provide a diffusion path for a conductive material, such as copper.

Often, an etchant stop is used between the ILD's to prevent such micro trenching. For instance, the silicon nitride layer shown in FIG. 1, if used between the layers 14 and 16 prevents micro trenching. However, the silicon nitride layer or similar etchant stops or hard masks, require relatively high k materials. As a result, they deteriorate the electrical characteristics because of the increased capacitance between the adjacent conductors and vias.

Figure 2:
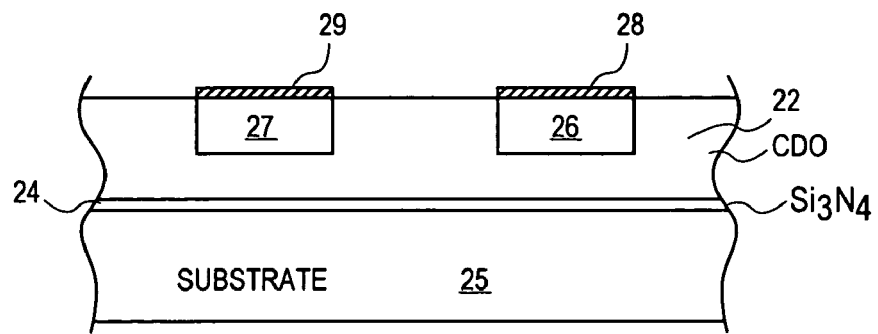
FIGS. 2–6 illustrate a method in accordance with an embodiment of the present invention.

Referring now to FIG. 2, substrate 25 is illustrated which may be an ordinary monocrystalline silicon substrate in which field-effect transistors are fabricated. The substrate 25 is illustrated covered with a layer 24 of silicon nitride. A layer of interconnects or contacts may be disposed below the layer 24. A first layer of carbon doped oxide CDO 22 is formed on the layer 24 and includes inlaid conductors 26 and 27. These conductors have their upper surfaces clad in a selectively deposited metal, such as cobalt, as will be described later. The conductor 26 includes the cladding 28 and the conductor 27, the cladding 29. Not shown in FIG. 2, are vias or other interconnect structures extending into the substrate or into an underlying interconnect layers disposed below layer 24. The substrate of FIG. 2, with the layer 22 and inlaid conductors 28 and 29 may be fabricated as known in the prior art.

A layer 30 of carbon free oxide is formed over the structure of FIG. 2 including over the cladding 28 and 29. This layer may be formed using any one of a number of well-known processes, for instance, using chemical vapor deposition (CVD). The layer may comprise a silicon dioxide ($SiO_2$) or, for instance, a fluorine doped oxide (SiOF).

Another layer 31 of a dielectric material, specifically a carbon doped oxide is next formed on the layer 30. As will be seen, both layers 30 and 31, form a ILD. In subsequent processing, vias are formed within the layer 30 and conductors within the layer 31.

Figure 3:
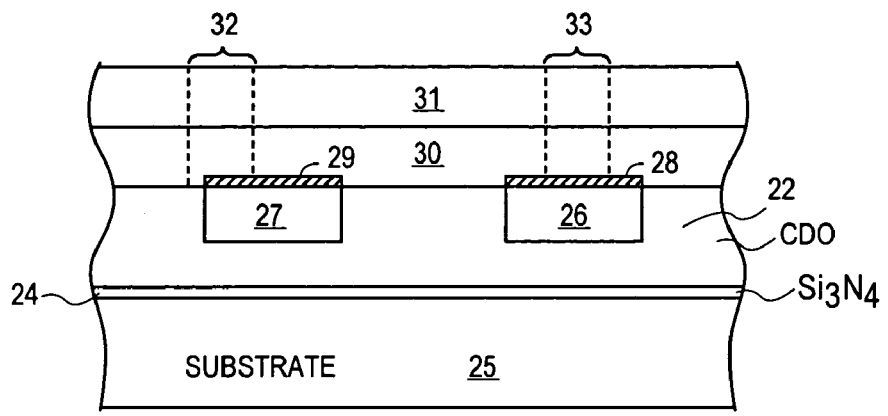
Figure 4:
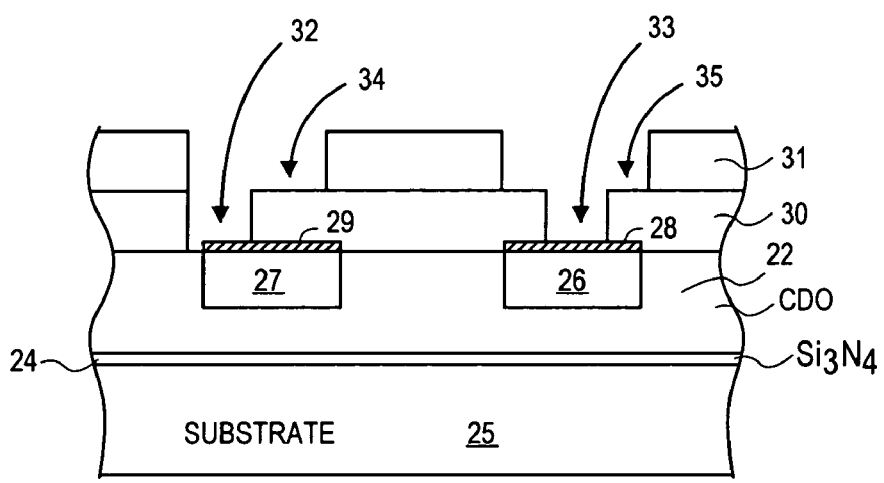

Next, via openings 32 and 33, shown in FIG. 4, are etched through both the layers 30 and 31. The via openings are shown in dotted lines in FIG. 3. An ordinary photoresist may be formed on the upper surface on the layer 31, and exposed to define the openings 32 and 33. A plasma etching step is used to etch through the layers 30 and 31. An etchant such as a mixture of CxFy radical generating gas (for example C4F8, C4F6, C2F6) and one or more of additives selected from argon, oxygen, nitrogen, and carbon monoxide may be used. Hydrogen-containing gases, like CHF3, CH2F2 may also be used with the aforementioned additive gas feed. The etchant etches through the layer 31 more slowly than the layer 30. This occurs since the carbon in the carbon doped oxide slows the etching.

As the etchant etches though layer 30, ideally the etching stops on the cladding protecting the conductors. Opening 33 ends on the cladding 28 and not the underlying layer 22 because it is fully "landed." Here, the etching stops upon reaching the cladding. As is often the case, due to misalignments, the openings are unlanded or partially unlanded. Opening 32 is shown as being partially unlanded and extends along the side of the conductor 29. However, since the etchant rate of the doped oxide layer 22 is less than the etchant rate of the carbon free oxide layer 30, the layer 22 acts substantially as an etchant stop. The etchant rate in the carbon doped oxide is approximately 30% to 50% slower or less than the etching rate in the carbon free oxide in a typical process. A mixture of CxFy radical generating gas (for example C4F8, C4F6, C2F6) and one or more of additives selected from argon, oxygen, nitrogen, and carbon monoxide. Hydrogen-containing gases, like CHF3, CH2F2 may also be used with the aforementioned additive gas feed. The carbon content of the carbon-doped oxide determines the degree of selectivity in the etch rate with respect to the oxide. The higher the carbon content, the slower the etch rate of the carbon doped oxide. Thus, the etching of opening 32 does not cause a micro trench along the side of the conductor 27 as shown in FIG. 1, even though it is partially unlanded.

The etching as described above, thus takes advantage of the selectivity of etching rates between the carbon doped oxide and the carbon free oxide. As discussed above, the etchant rate in the carbon doped oxide is slower, and consequently, the carbon doped oxide layer acts as an etchant stop. Additionally, it has been demonstrated that as feature size decreases, the etchant rate in the carbon doped oxide slows more than in the carbon free oxide. This is important since it provides more discrimination as feature size decreases. Therefore, in a damascene process, the via openings are etched without the use of an etchant stop without significant micro trenching as shown in FIG. 1.

Now, another masking step is used to define the trenches 34 and 35. In some processes, however, before this occurs, the via openings are filled with a sacrificial light absorbing material (SLAM). See co-pending application Ser. No. 10/360,708, filed Feb. 8, 2003, entitled "Polymer Sacrificial Light Absorbing Structure and Method" and co-pending application Ser. No. 10/715,956, filed Nov. 17, 2003, entitled, "A Method to Modulate Etch Rate in SLAM," for a discussion of this material and related processes.

Before the deposition of a barrier material and conductive materials, known cleaning steps are used which are compatible with the ILD materials, copper and cobalt.

Now, a barrier layer is formed, lining the via openings and trenches as is well known. Typical barrier materials can be refractory metals and alloys such as Ta, TaN, TaSiN, TiN, TiSiN, WN, WiSiN, as well as multilayers of these materials, for instance, Ta/TaN.

Next, a seed material is formed particularly where electroplating is used for the deposition of a conductive material. The seed material can be copper, copper alloys which include (Sn, In, Mg, Al, etc.). Then copper is electroplated onto the barrier layer.

Alternatively, the seed layer and barrier layer may be, for instance, cobalt, where the deposition of the conductive material occurs by plasma vapor deposition (PVD), chemical vapor deposition (CVD) or atomic layer deposition (ALD) with electroless copper alloy deposition.

Electroplated or electroless plated copper including alloys with Sn, In, Sb, Bi, Re or others are used to fill the vias and trenches. As is normal for such processes, the upper surface of the layer 31 becomes covered with a barrier layer and conductive material. Chemical mechanical polishing (CMP) is used to remove these conductive layers from the upper surface of the layer 31, so that the conductors remain within the trenches, spaced-apart by the insulation provided by layer 31.

Following this, cladding material is formed over the exposed surfaces of the conductors to seal them. For instance, a selective, electroless deposition of cobalt may be used which forms cladding over the conductors. This electroless formation of cobalt may include alloys using Ni and Fe. Complexing agents such as citric, malonic, succinic acids, EDA etc. are used along with buffer agents ($NH_4Cl$, $(NH_4)2SO_4$, etc.) reducing agents (DMAB, hypophosphite, borohydride etc.) and pH adjuster (TMAH, KOH, etc.). This may be the same process used to form the cladding 28 and 29. This is discussed in co-pending applications Ser. No. 09/353,256, filed Dec. 28, 2000, entitled, "Interconnect Structures and a Method of Electroless Introduction of Interconnect Structures" and Ser. No. 10/459,131, filed Jun. 10, 2003, entitled, "Method for Improving Selectivity of Electroless Metal Deposition."

Figure 5:
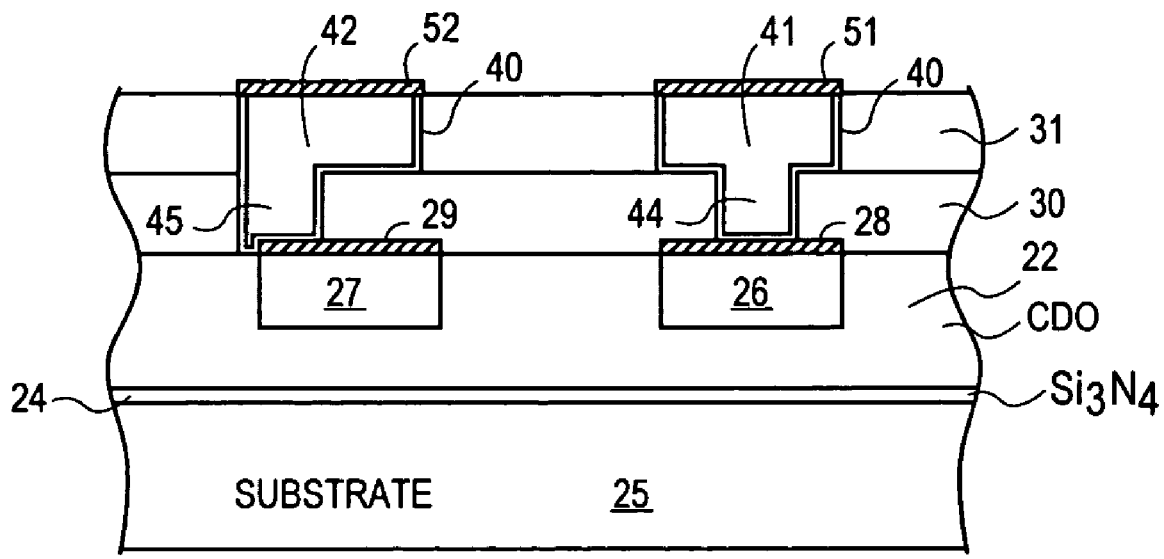

The resultant structure is shown in FIG. 5 with a barrier layer 40 lining the trenches and via openings. Vias 44 and 45 are formed within the via openings (within layer 30) and conductors 41 and 42 are formed within the trenches. Overlying the upper surface of the conductors, the cladding 51 and 52 seals the conductors 41 and 42, respectively.

In one embodiment, the thickness of the layer 30 is approximately equal to the height of the vias 44 and 45. The thickness of the layer 31 is approximately equal to the thickness of the conductor 41 and 42.

Figure 6:
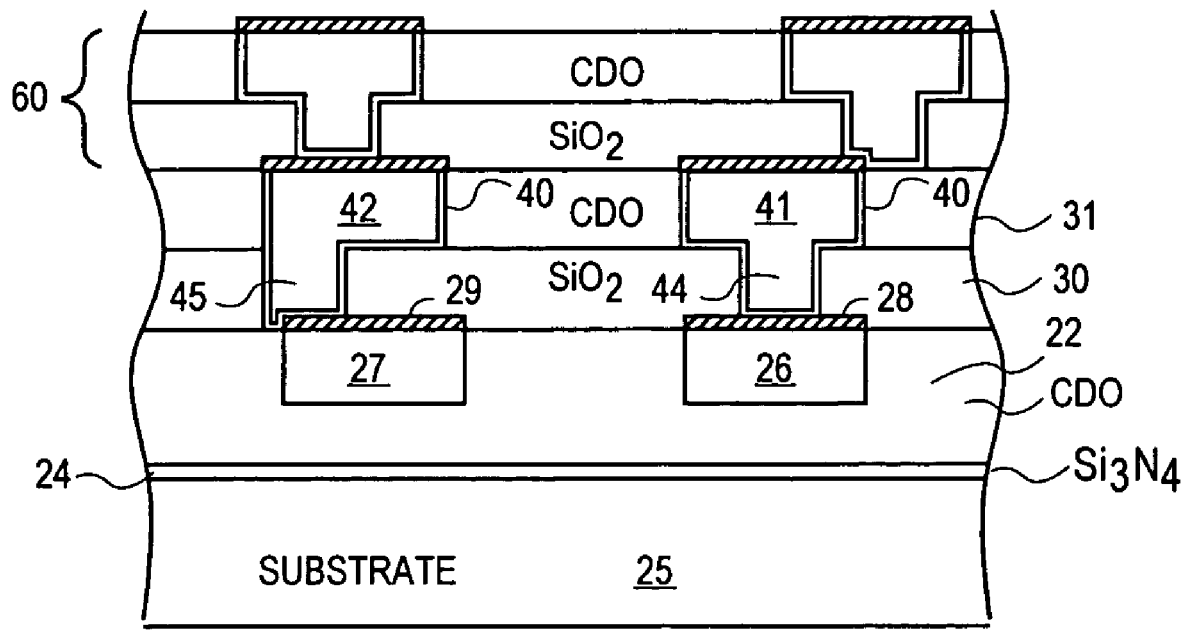

The processing described above in conjunction with FIGS. 2–5 can be repeated to form an additional layer or several layers of interconnects above the layers shown in FIG. 5. In FIG. 6, an additional layer 60 of interconnects is shown formed above the structure of FIG. 5 using the fabrication described in conjunction with FIGS. 2–5.

In prior art structures where a carbon doped oxide is used, the structure is mechanically weak because of the lack of strength in this material. With the processing described above, the mechanical strength of the ILD is increased since the mechanically weak carbon doped oxide layers are contained between the mechanically stronger carbon free oxide layers.

Thus, a damascene process has been described. The process does not require a separate etchant stop or hard mask. Rather, it relies on the fact that the carbon doped oxide etches more slowly than the carbon free oxide.

What is claimed is:

1. A method for fabricating an interconnect layer comprising:
    forming a layer of carbon free oxide directly on an underlying first layer of carbon doped oxide;
    forming a second layer of a carbon doped oxide directly on the carbon free oxide;
    etching via openings in the layer of the carbon free oxide and second layer of carbon doped oxide;
    etching trenches in the second layer of carbon doped oxide;
    filling the via openings and trenches with a barrier layer and a conductive material, wherein the depth of the resulting via approximately equals the thickness of the layer of carbon free oxide.

2. The method defined by claim 1 wherein, the carbon free oxide comprises silicon dioxide or fluorine doped oxide.

3. The method defined by claim 2 wherein, an etchant is used for etching the via openings, and etches the carbon doped oxide more slowly than it etches the carbon free oxide.

4. The method defined by claim 3 wherein, the same etchant is used to etch both the carbon free oxide and carbon doped oxide.

5. The method defined by claim 4 wherein, the etching of both the carbon free oxide and the carbon doped oxide is plasma etching.

6. The method defined by claim 1 including, planarizing the upper surface of the second layer of carbon doped oxide following the filling of the via openings and trenches with a barrier layer and conductive material so as to remove the barrier layer and conductive material from the upper surface of the second layer of carbon doped oxide.

7. The method defined by claim 6 including, the step of forming a cladding material over the conductive material in the trenches.

8. The method defined by claim 7 wherein, the cladding material comprises cobalt.

9. The method defined by claim 8 including, the step of filling the via openings with a sacrificial light absorbing material prior to etching the trenches in the second layer of carbon doped oxide.

10. The method defined by claim 9 wherein, the depth of the trenches etched in the carbon doped oxide is approximately equal to the thickness of the second layer of carbon doped oxide layer.

11. The method defined by claim 10 including, repeating the method of claim 10 so as to fabricate an overlying, additional, interconnect layer.

12. A method for fabricating an interconnect layer having vias and conductors comprising:

forming a layer of a carbon free oxide on an underlying first layer of carbon doped oxide;

forming a second layer of a carbon doped oxide on the layer of carbon free oxide;

etching via openings through the second layer of carbon doped oxide and the layer of carbon free oxide so as to expose underlying conductors;

etching trenches in the second layer of carbon doped oxide, the trenches having a depth approximately equal to the thickness of the second layer of carbon doped oxide;

filling the via openings and trenches with a barrier layer and conductive material, the resulting via having a depth approximately equal to the thickness of the layer of carbon free oxide;

planarizing an upper surface of the second layer of carbon doped oxide so as to remove the barrier layer and conductive material from between the trenches leaving conductors in the trenches; and forming cladding over the conductors.

13. The method defined by claim 12 wherein the carbon free oxide is a silicon dioxide or a fluorine doped oxide.

14. The method defined by claim 13 wherein the cladding comprises electrolessly and selectively deposited cobalt.

15. The method defined by claim 14 wherein the barrier layer comprises tantalum and the conductive material comprises copper.

16. The method defined by claim 15 including the step of filling the via opening with a sacrificial light absorbing material prior to etching the trenches in the second layer of carbon doped oxide.

17. The method of fabricating an interconnect layer defined by claim 12 including repeating the steps of claim 12 so as to form an overlying interconnect layer.

18. The method of fabricating an interconnect layer defined by claim 16 including repeating the process defined by claim 16 to fabricate an additional overlying interconnect layer.

* * * * *